United States Patent [19]

Kalkbrenner

[11] 4,097,887

[45] Jun. 27, 1978

[54] LOW RESISTANCE, DURABLE GATE CONTACT PAD FOR THYRISTORS

[75] Inventor: Francis William Kalkbrenner, West Chester, Pa.

[73] Assignee: General Electric Company, Philadelphia, Pa.

[21] Appl. No.: 722,973

[22] Filed: Sep. 13, 1976

[51] Int. Cl.$^2$ .............. H01L 29/74; H01L 23/42; H01L 23/44

[52] U.S. Cl. .................. 357/38; 357/55; 357/39; 357/79; 357/86

[58] Field of Search .............. 357/38, 39, 86, 55, 357/79

[56] References Cited

U.S. PATENT DOCUMENTS

| | | | |
|---|---|---|---|
| 3,475,666 | 10/1969 | Hutson | 357/86 |
| 3,494,791 | 2/1970 | Eugster | 357/86 |
| 3,525,910 | 8/1970 | Philips | 357/79 |
| 3,565,705 | 2/1971 | Renelle | 357/86 |
| 3,725,753 | 4/1973 | Garrett | 357/86 |
| 3,751,726 | 8/1973 | Einthoven et al. | 357/86 |
| 3,755,722 | 8/1973 | Harland et al. | 357/86 |
| 3,879,744 | 4/1975 | Dumas | 357/86 |
| 3,996,601 | 12/1976 | Hutson | 357/86 |
| 4,035,831 | 7/1977 | Saeki | 357/79 |

FOREIGN PATENT DOCUMENTS 2,461,207  6/1976  Germany ............ 357/38

Primary Examiner—Andrew J. James
Attorney, Agent, or Firm—William Freedman; Carl L. Silverman

[57] ABSTRACT

The specification discloses a power thyristor of the P-gate type wherein the outer cathode layer of N type conductivity overlies the P layer in the gate region. A gate pad is formed as a metallic coating over the N layer in the gate region with direct metallic connection through or around the underlying N layer and into the P type gating layer thereunder.

14 Claims, 3 Drawing Figures

LOW RESISTANCE, DURABLE GATE CONTACT PAD FOR THYRISTORS

My invention relates to high power semiconductor devices for the thyristor type, and more particularly to an improved gate contact pad for SCR type thyristors.

Typically, a power thyristor comprises a thin, broad area disc-like body having four distinct layers of semiconductor material (preferably silicon) with contiguous layers being of different P and N conductivity types to form three back-to-back PN rectifying junctions in series. To the outer surfaces of the respective end layers of the silicon body a pair of main current carrying metallic contacts or electrodes (anode and cathode) are conductively joined in low resistance ohmic contact therewith, and the body is normally equipped with at least one control or gate contact surface connected to an accessible intermediate layer of the body for triggering conduction between the main electrodes. The control electrode, or gate, may be connected to the intermediate P layer or to the intermediate N layer. To complete the device the silicon body is sealed in an insulating housing with exposed main and control electrodes for connection to an associated external electric circuit. The construction and mode of operation of such devices are well known to the prior art.

In making gate electrode contact to an intermediate layer of the silicon body it is prior practice to remove the adjacent outer layer of conductive silicon over a small surface region thereby to expose an area of the underlying intermediate layer. The area thus exposed is coated with conductive metal, such as aluminum or the like, as by sputtering or vapor-plating (i.e., evaporation) and subsequent heat treatment, thereby to form a gate contact pad in low resistance electrical contact with the contiguous silicon layer. Such aluminum contact layer is ordinarily of the order of about 0.5 mils in thickness. A gate contact member is then pressure biased into contact with the metalized pad.

It has been found that in operation the biased gate contact member may wear through the 0.5 mil layer of contact metal of the gate pad. The biased gate contact member would then engage directly the underlying gate layer of the silicon body. If this intermediate gating layer is lightly doped, i.e., of relatively low impurity concentration, at the point of contact, it will be of such high resistance that an undesirable voltage drop will occur at a point of direct contact with the pressure biased gate contact member. This is so whether the intermediate gating layer is of N type material or of P type material, although in general contact to lightly doped P type material is more likely to be a problem.

Accordingly, it is a principal object of my invention to provide a gate contact pad for thyristors which preserves good electrical contact with the gating layer of the device even though the surface metalization of the gate pad region is worn through by a gate contact member in pressure biased engagement therewith.

In carrying out my invention in one preferred embodiment I utilize a P-gate type SCR thyristor wherein an outer cathode layer of highly doped N or N+ type silicon is not removed in the gate contact region but is allowed to overlie the contiguous P type gate layer. Channels are etched transversely through this outer N layer and partially into the P layer in the gate contact region. The channels are then filled with conducting metal and the outer surface of the N type material in the gate region is coated with conducting metal, thereby to form a metalized gate pad overlying the outer N layer but having direct metallic contact through the metalized channels with the underlying P base layer of the silicon body.

My invention will be more fully understood and its various objects and advantages further appreciated by referring now to the following detailed specification taken in conjunction with the accompanying drawing, wherein.

Figure 1:
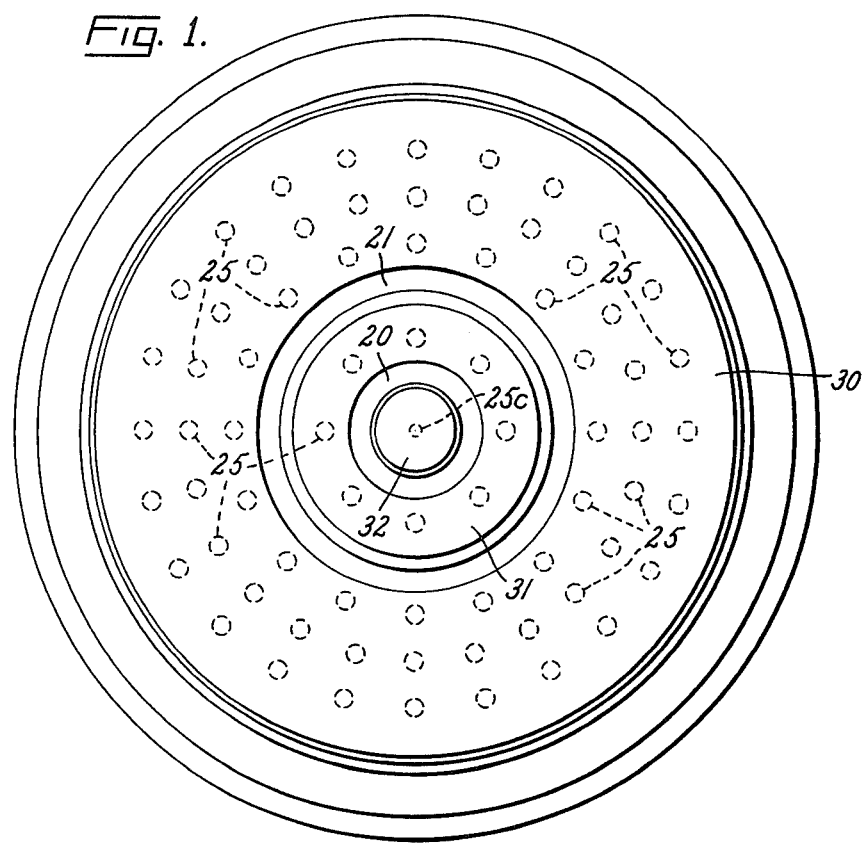
FIG. 1 is a plan view of a semiconductor disc or wafer embodying my invention.
Figure 2:
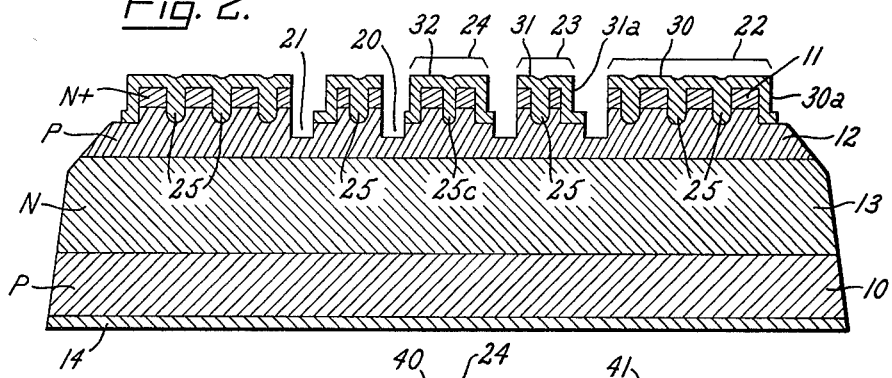
FIG. 2 is a diammetrical cross sectional view of the wafer illustrated at FIG. 1.
Figure 3:
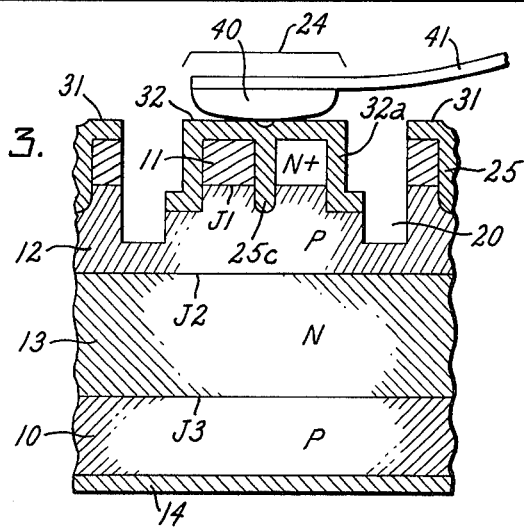
FIG. 3 is an enlarged fragmentary cross sectional view of the central gate contact region of FIG. 2 showing a gate contact member engaging the wafer in that region.

At FIGS. 1 to 3 I have illustrated my invention applied to an SCR thyristor of the shorted emitter type having an auxiliary region of the outer N layer of silicon isolated from the gate region and from the cathode to provide a pilot SCR for initiating a high energy turn on signal to the main body of the thyristor. Such a device is known as an "FI Gate" thyristor and is described and claimed in U.S. Pat. Reissue No. 27,440-DeCecco et al.

Referring first to FIGS. 1 and 2, the multi-layer thyristor wafer illustrated is a circular disc of silicon comprising four layers, or lamellar zones, of alternately opposite P and N conductivity types forming three PN junctions therebetween. These four layers comprise end or outer anode and cathode layers 10 and 11 of P and N type silicon, respectively, and intermediate base layers 12 and 13 of P and N type silicon, respectively thereby to form three PN junctions J1, J2 and J3 in series between the opposite faces of the wafer. The emitter layer 11 is preferably highly doped with impurity, for example to a concentration of about $10^{21}$ atoms per cubic centimeter, and is indicated on the drawing as N+ material. The contiguous P base layer 12 is lightly doped at the junction J1.

On the outer surface of the P type anode layer 10 there is formed, as by alloying, a thin layer 14 of aluminum constituting an anode electrode. At the opposite face of the wafer the N type emitter layer 11 is divided into a central region and two concentric annular regions by circular slots 20, 21 extending through the N layer 11 and partially through the adjacent P base layer 12. These circular slots 20, 21 divide the emitter layer 11 of the wafer into a main peripheral cathode region 22, an intermediate annular auxiliary emitter region 23 and a central gate region 24. As is well known to those skilled in the art the slots 20, 21 may be formed by etching.

In the embodiment of the invention shown for the purpose of illustration I provide throughout all regions of the N+ type layer 11 a plurality of axial channels 25, including a central channel 25C in the gate region, which channels extend transversely through the layer 11 and partially into the adjacent P base layer 12. Finally, the channels 25, 25C are filled with aluminum to form conductive columns and the outer surfaces of all regions of the N+ layers 11 are coated with aluminum to a thickness of the order of 0.5 mils, preferably by evaporation. The annular cathode region coating 30 extends over the outer peripheral edge of the region at 30a and forms a cathode electrode. The annular auxiliary region coating 31 extends over the outer peripheral edge of that region at 31a to form an auxiliary contact.

The central gate region coating 32 extends around the entire peripheral edge of that region at 32a to form a gate contact pad, the central channel 35c and edge coating 32a in this region directly electrically connecting the gate pad 32 to the P layer 12. A device having such metal-filled channels 25 conductively short circuiting the emitter layer 11 in the cathode region is known as a shorted emitter type semiconductor device and is disclosed and claimed in U.S. Pat. No. 3,476,933-Aldridge et al. As this description proceeds it will become apparent that, while my invention is readily applicable to shorted emitter type devices and to pilot SCR, or FI Gate devices, it is not limited in its application to such devices but concerns primarily the formation of the central gate contact pad 32 of the device.

As this description proceeds it will become apparent to those skilled in the art that whether or not shorting channels 25 are provided in the cathode region 22 the gate region 24 must be provided with conductive paths such as 32a 25c between the gate layer 12 and the gate contact layer 32. While the edge coating 32a alone will serve this purpose it is desirable to provide also one or more axial channels such as 25c in the gate region.

In prior SCR devices of the type described gate contact to the P base layer 12 of the device is ordinarily made by removing, as by etching, a portion of the N+ type emitter layer 11 in the central region 24, thereby to expose a portion of the P layer 12. This exposed portion is coated with a thin layer of aluminum, as by vapor deposition or sputtering, to form a contact pad directly overlying the P base layer 12. As described above, such a structure developes high contact resistance if the metal coating of the gate contact pad is worn through so that the spring pressed gate contact member directly engages the underlying high resistance P type layer 12.

As shown most clearly at FIGS. 2 and 3, I provide an improved gate contact pad in the central surface region 24 by leaving the N+ type emitter layer 11 in place in this region and utilizing the metal coating 32 on that layer as a gate contact pad. The central aluminum column 25C and edge coating 32a in the gate region 24 short circuit the N+ layer 11 in that region and connect the pad 32 directly to the underlying P base layer 12. By way of specific illustration, the gate pad region 24 may be of the order of 40 mils in diameter, the aluminum metalization 32, 32a, 0.4 or 0.5 mils in thickness and the short circuiting column 25C about 3 mils in diameter.

At FIG. 3 I have shown also a gate contact lead comprising a broad area disc-shaped contact member or button 40 mounted upon a resilient contact arm 41 and spring pressed by the arm 41 into engaging contact with the metal gate pad 32. Preferably the contact member 40 is substantially greater in area than the cross sectional area of the metal-filled channel 25C in the gate pad region. Desirably the contact area of member 40 may be of equal or nearly equal to the area of the gate pad 32 itself. It will of course be evident to those skilled in the art that the gate contact member 40, 41 may be integral, as a spring arm having an enlarged contact end.

It will now be evident that in operation the spring pressed gate contact member 40 makes good electrical contact with the P type base layer 12 through the aluminum coating 32, 32a and the aluminum filled channel 25C in the gate region, the N+ type material in the emitter layer 11 in the gate region being thus short circuited. In the event the metal coating 32 is worn away by abrasion against the contact member 40 the member 40 will be brought into direct contact with the underlying N+ type material of layer 11. Such direct contact is assured in the illustrated structure, wherein the cross sectional area of the central short circuiting column 25C is very much smaller than the contact area of the contact member 40. The resistivity of this N+ type layer is very low and approaches that of metal; its conductive connection with the short circuiting column 25C and annular metal coating 32a is sufficiently good that any current entering the N+ type material under the gate pad will be transmitted directly into the P base 12 through the short circuiting paths and without crossing the PN junction J1.

While I have illustrated my invention as applied to a shorted emitter type thyristor having a plurality of metal-filled short circuiting channels 25 throughout the cathode region as well as the gate pad region, it is not limited in its application to shorted emitter type thyristors. Similarly, while I have illustrated a thyristor of the FI Gate type having an auxiliary pilot region 23 it is equally applicable to other gated power thyristors. My improved gate pad is applicable to any SCR type thyristor whether or not an auxiliary pilot region is included and whether or not conductive short circuits are provided throughout the cathode region. It is especially useful with both P-gate and N-gate thyristors wherein the intermediate gating layer is lightly doped and thus of high contact resistance.

Thus, while I have described a particular embodiment of my invention and by way of illustration, modifications will occur to those skilled in the art and I therefore wish to have it understood that I intend in the appended claims to cover all such modifications as fall within the true spirit and scope of my invention.

What I claim as new and desire to secure by Letters Patent of the United States is:

1. A thyristor comprising, a multi-layer body of semiconductor material having opposite end layers and at least one intermediate base layer of alternately opposite P and N conductivity types, one said end layer being slotted to form laterally adjacent main and control regions, said main region and the opposite end layer of said body being metalized on their outer surfaces to form two main electrodes of said body, said one end layer in said control region having a relatively lower impurity concentration contiguous base layer and being apertured to provide at least one channel extending transversely therethrough to said base layer, a body of conductive metal coating said one higher impurity concentration end layer in said control region and filling said channel thereby to form a control electrode contact surface directly electrically connected to said base layer through said channel, said body of conductive metal extending over lateral edges of said control region into electrical contact with said base layer, and a control contacting means pressed against said contact surface and having a contact area appreciably greater than the cross sectional area of said transverse channel wherein the wearing away of said contact surface of metal causes said contacting means to be brought into direct contact with said higher impurity concentration end layer such that substantially all current entering into said end layer under said contact surface is transmitted directly into said base layer through said body of conductive metal without crossing the junction between said higher impurity end layer and said base layer.

2. A thyristor according to claim 1 wherein said body of semiconductor material comprises four layers of alternately opposite P and N conductivity types, said one relatively higher impurity end layer is of N type and said base layer is a P type layer.

3. A thyristor according to claim 2 wherein said one end layer constitutes an emitter and is provided throughout said main region with metal filled transverse channels extending into short circuiting contact with the underlying P type layer.

4. A thyristor according to claim 1 wherein the slots defining said control region of said one end layer and said channel through said one end layer extend partially through said underlying base layer 5. A thyristor comprising, a multi-layer body of semiconductor material having opposite end layers and at least one intermediate base layer of alternately opposite P and N conductivity types, said end layers being metalized at least in part to provide a pair of main electrodes for said device, means defining a gate contact region of said base layer, said base layer having a relatively low impurity concentration in said gate contact region, a layer of semiconductor material having relatively high impurity concentration overlying said base layer in said gate contact region, said high concentration layer being metalized on its exposed surface to provide a gate contact pad, said metallization extending over pheripheral edges of said gate contact region into electrical contact with said base layer, at least one conductive path of relatively small cross sectional area electrically connecting said gate contact pad directly to said base layer thereby to short circuit said high concentration layer, and a pressure biased gate contact member having a relatively broad area contact base engaging said gate contact pad.

6. A thyristor according to claim 5 wherein said one end layer is of N type conductivity, said gate region is defined by slots extending through said end layer and partially into said base layer and at least one column of metal extends through said one end layer and partially into said base layer in said gate contact region.

7. A thyristor in accordance with claim 1 in which said relatively higher impurity concentration end layer comprises a N+ layer and said contiguous base layer comprises a P layer.

8. A thyristor in accordance with claim 5 in which said relatively higher impurity concentration layer comprises a N+ layer and said relatively low impurity layer comprises a P layer.

9. A controlled high power semiconductor rectifier of the type which includes at least four layers of semiconductor material with contiguous layers being of different P and N conductivity types so as to form three back-to-back PN junctions, a pair of main current carrying metallic contacts respectively contacting end layers of the semiconductor material, one of the end layers being slotted to form laterally adjacent main and gate regions, gate contact means for conductively contacting to one of the intermediate layers of the semiconductor material with the intermediate layer being of relatively lower impurity concentration in relation to the slotted end layer, and pressure biased contacting means in conducting relation with the gate contact means, wherein the gate contact means comprises:

(a) at least one conductive column extending through said slotted end layer in said gate region, said conductive column contacting said intermediate layer; and (b) a conductive coating disposed on said end layer in said gate region and in conducting relation with said column, said conductive coating extending over edges of said gate region and contacting said intermediate layer.

10. A controlled high power semiconductor rectifier in accordance with claim 9 in which said pressure bias contacting means includes a surface contact area which is larger than the surface contact area of said conductive column such that wear of said conductive coating causes said pressure bias contacting means to contact said slotted end layer of semiconductor material.

11. A controlled high power rectifier in accordance with claim 10 in which said pressure bias contacting means comprises a spring bias contact.

12. A controlled high power rectifier in accordance with claim 9 in which said slotted end layer comprises N type material and said intermediate layer comprises P type material.

13. A controlled high power rectifier in accordance with claim 9 in which said slotted end layer comprises N+ type material and said intermediate layer comprises P type material.

14. A controlled high power rectifier in accordance with claim 9 in which said conductive column extends partially through said intermediate layer.

* * * * *